United States Patent
Fuderer et al.

(10) Patent No.: US 6,745,064 B2
(45) Date of Patent: *Jun. 1, 2004

(54) MAGNETIC RESONANCE METHOD FOR FORMING A FAST DYNAMIC IMAGING

(75) Inventors: Miha Fuderer, Eindhoven (NL); Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 09/940,042

(22) Filed: Aug. 27, 2001

(65) Prior Publication Data

US 2002/0042568 A1 Apr. 11, 2002

(30) Foreign Application Priority Data

Jul. 31, 2000 (EP) .............................. 00202728

(51) Int. Cl.$^7$ ............................... A61B 5/055
(52) U.S. Cl. ................. 600/410; 324/307; 324/309
(58) Field of Search ................ 600/410, 422, 600/421; 324/307, 309, 312, 318, 322

(56) References Cited

U.S. PATENT DOCUMENTS

| | | | |
|---|---|---|---|
| 5,713,358 A | 2/1998 | Mistretta et al. | 128/653.2 |
| 6,289,232 B1 * | 9/2001 | Jakob et al. | 600/410 |
| 6,448,771 B1 * | 9/2002 | Harvey et al. | 324/307 |
| 2002/0158632 A1 * | 10/2002 | Sodickson | 324/307 |

FOREIGN PATENT DOCUMENTS

| | | | |
|---|---|---|---|
| WO | WO9927382 | 6/1999 | G01R/33/563 |
| WO | WO9954746 | 10/1999 | G01R/33/3415 |

OTHER PUBLICATIONS

W. E. Kyriakos et al, "Sensitivity Profiles from an Array of Coils for Encoding and Reconstruction in Parallel (Space Rip)", Magnetic Resnance in Medicine, Academic Press, Duluth, MN, US vol. 44, No. 2 Aug. 2000, PP 301–308, XP000947389.

T. B. Parrish et al, "Hybrid Technique for Dynamic Imaging", Magnetic Resonance in Medicine, Academic Press, Duluth, NM, US, vol. 44, No. 1 Jul. 2000, PP 51–55, XP000947328.

Tsai Chi–Ming et al, "Reduced Aliasing Artifacts Using Varible–Density K–Space Sampling Trajectories" Magnetic Resonance in Medicine, Mar. 2000, Wiley, USA, vol. 43, No. 3, PP452–458, XP002179553.

P.M. Glover, "A Robust Single–Shot Partial Sampling Scheme", Magnetic Resonance in Medicine, Jul. 1995, USA, vol. 34, No. 1, PPP74–79, XP002179554.

D.K. Sodickson et al, "Simultaneous Acquisitins of Spatial Harmonics (Smash) : Fast Imaging with Radiofrequency Coil Arrays", Magnetic Resonance in Medicine, Academic Press, Dulth, MN, US, vol. 38, No. 4, Oct. 1, 1997, PP 591–603, XP000720010.

R. Heidemann et al, "Variable Density Auto–Smash Imaging", Proceedings of the International Society for Magnetic Resonance in Medicine, Eighth Scientific Meeting and Exhibition, Denver, Colorado, USA, Apr. 1–7, 2000, vol. 1, p. 274 XP002179552.

* cited by examiner

*Primary Examiner*—Eleni Mantis Mercader
(74) *Attorney, Agent, or Firm*—John Vodopia

(57) ABSTRACT

A magnetic resonance method is described for fast dynamic imaging from a plurality of signals acquired by an array of multiple sensors. The k-space will be segmented into regions of different acquisition. In the region of a first acquisition type a first partial image will be reconstructed by data of normal magnetic resonance imaging with a full set of phase encoding steps or by data of fast dynamic imaging with a number of phase encoding steps being with a low reduction factor with respect to the fall set thereof and in the region of a second acquisition type a second partial image will be reconstructed by data of fast dynamic imaging with a full reduction factor. Thereafter the first and the second partial images will be formed to the full image of the scanned object.

9 Claims, 1 Drawing Sheet

MAGNETIC RESONANCE METHOD FOR FORMING A FAST DYNAMIC IMAGING

Figure 1:
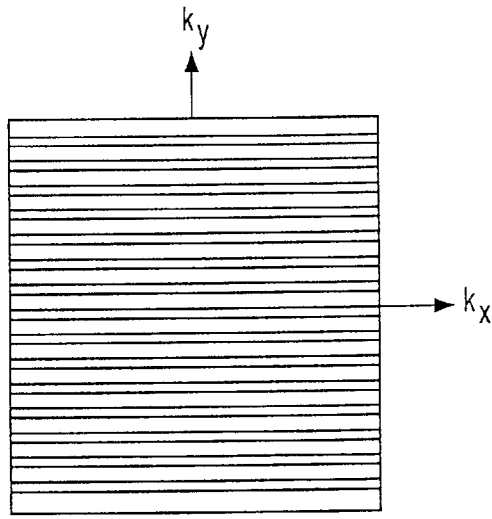

The invention relates to a magnetic resonance method for forming a fast dynamic imaging form a plurality of signals acquired by an array of multiple sensors. The invention further relates to a magnetic resonance imaging apparatus for obtaining a fast dynamic image and to a computer program product according to the disclosed method.

In magnetic resonance imaging there is a general tendency to obtain acceptable images in shorter time. For this reason there have been developed recently the sensitivity encoding method called "SENSE" by the Institute of Biomedical Engineering and Medical Informations, University and ETH Zurich, Switzerland. The SENSE method is based on an algorithm which directly acts on the image as detected by the coils of the magnetic resonance apparatus, wherein subsequent encoding steps can be skipped and thus an acceleration of the signal acquisition for imaging of a factor two to three can be obtained. Crucial for the SENSE method is the knowledge of the sensitivity of the coils, which are arrange in so called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts p. 579, 799, 803 and 2087.

The SENSE method is preferred for acceleration of the signal acquisition for magnetic resonance imaging, which results in an enormous reduction in operating time. However, the method can only be used properly if the coil sensitivity is exactly known. Otherwise imperfections will cause fold-over artefacts which provide wrong images. In practice the coil sensitivity cannot be estimated perfectly and will be dependent on fluctuations in time (movement of the patient, temperature influences, etc.).

Another important problem of the SENSE method is the spatially varying noise level in the resulting image. More specifically, the resulting image can have regions of extremely high noise level, due to local "underdetermination" of the information provided by the coil patterns.

It is an object of the present invention to reduce the noise level over the full image during fast dynamic imaging to a great extent.

The main issue of the present invention is based on the solution to acquire the low-spatial frequencies, i.e. the low-order k-lines, with full density by using the normal magnetic resonance imaging, and to acquire the remaining high-spatial frequencies, i.e. the high-order k-lines, with reduced density, i.e. with the SENSE imaging method. In more general terms: it is proposed to have a k-space coverage that is varying over k-space, the density of the acquired information being higher in the centre than for the high-spacial frequency information.

An important additional advantage of the imaging in full density of the centre of k-space is that the SENSE acquisition can be reconstructed without a-priori knowledge of coil sensitivity maps. Thus, more accurate images with an improved signal-to-noise ratio can be made at the same rate as with the SENSE method.

These and other advantages of the invention are disclosed in the dependent claims and in the following description in which an exemplified embodiment of the invention is described with respect to the accompanying drawings. It shows These and further advantages of the invention are disclosed in the dependent claims and in the following description in which an exemplified embodiment of the invention is described with respect to the accompanying drawings. It shows FIG. 1. the regular scanning of k-space according to the well-known acquisition scheme, FIG. 2, the regular scanning according to SENSE acquisition, and FIG. 3, the acquisition scheme according to the present invention.

Specific numbers dedicated to elements defined with respect to a particular figure will be used consistently in all figures if not mentioned otherwise.

Figure 2:
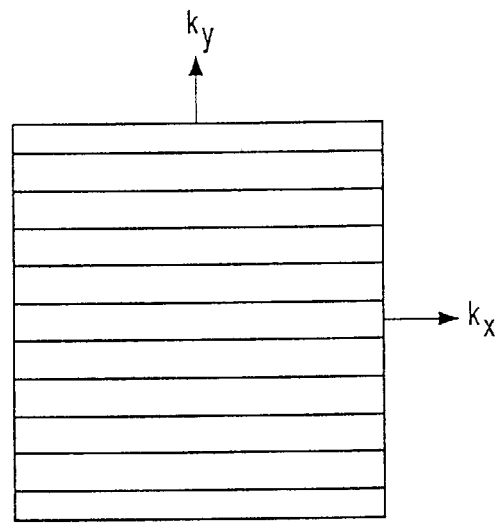

In FIG. 1 the regular acquisition scheme according to the well-known normal magnetic resonance methods is depicted. In FIG. 2 the acquisition scheme according to the SENSE method is shown. The resulting raw images consist of N mutually overlapping strips. Yet, this situation has been measured simultaneously with M coils, whereas M $\mu$ N. In fact, the actual measurement is acquired by using a step in k-space that is N times too large compared to the k-space step that Nyquist would prescribe for the regular acquisition of FIG. 1. A typical value of N, also called SENSE factor, is 3, which results in the acquisition scheme of FIG. 2, the data thereof is Fourier transformed. In effect, there exist for each pixel of the required image M equations and N unknowns, which can be solved as a set of linear equations. This results in the required image according to the SENSE acquisition scheme.

The main problem of this procedure is that, locally, the set of equations can become badly conditioned, i.e. almost singular. Since the input data or coil signals always contain noise, the ill-conditioning of the set of equations leads to an enormous increase in noise in the resulting image. In theory, for a location where the set is completely singular, the resulting noise (i.e. the noise in that region of the reconstructed image) becomes infinite. In practice, this is noticed as ugly "noisy patches" in the SENSE images. An additional problem is the necessity of coil-sensitivity maps, which are relatively time-consuming.

Figure 3:
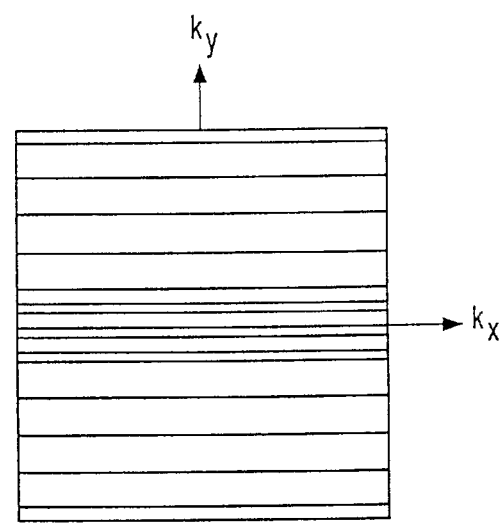

In order to speed-up the acquisition with higher accuracy of the reconstructed image, it is now proposed to segment the k-space into regions—in a basic set-up into two regions. The SENSE factor is different between different regions. Most notably, it is lower for the low spatial frequencies. In the most basic set-up the SENSE-factor equals 1 (i.e. normal acquisition) for the lowest spatial frequencies. This is shown in FIG. 3.

From such an acquisition two subsets can be extracted:
1) data from a regular SENSE scan, by dropping a number of central lines, in order to get the regularity of FIG. 2, the so-called "S-data". A reconstruction according to SENSE would result in a so-called "S-image".
2) data from a low-spatial frequency scan by dropping all data outside the central region, the so-called "L-data". This can be reconstructed in a regular manner to a low-resolution image, i.e. an image with a low refreshing rate.

On the condition that the L-data has been acquired with SENSE-factor=1, that data allows the reconstruction of coil sensitivity maps. This means, that a regular SENSE reconstruction of the S-data can be performed, even if no pre-acquired coil-sensitivity data is available. Moreover, the L-data has been acquired with no SENSE or with a moderate SENSE-factor, e.g. 1,5. This allows to reconstruct (either by plain FFT or by SENSE) a low-resolution image, the so-called "L-image", that can be regarded as stable in terms of signal-to-noise ratio. The basic idea is to use the data form the L-image wherever the S-image would be exceedingly noisy. This can be implemented in different ways.

A first reconstruction set-up, the so-called "hard substitution", reconstructs both an S-image and an L-image, and selects the most appropriate one of the two. The reconstruction process will "know" where this has to be done: if D is the determinant of the set of equations to be solved for each pixel of the image. The figure of D strongly varies over the whole image, and noise problems are expected in those regions of the S-image where the value of D is very low. On the basis of this knowledge the simplest procedure for combination of the S-images and the L-images will be, that for every pixel of the resulting image the corresponding value of the S-image is selected, if D is above a predetermined threshold. Otherwise, the corresponding value of the L-image is selected. A slight imperfection of this combination technique may be the adverse visual effect of "cut lines" in the image, separating low-noise regions from high-resolution regions, i.e. regions with a high refreshing rate of the image.

A second reconstruction set-up is the so-called "soft combination", which is a variation of the first one: the resulting image I is combined by the following equation:

$$I = f(D) \cdot L + (1 - f(D)) \cdot S$$

where f(D) is a function that approaches 1 for low values of determinant D and approaches 0 for high D values. L and S are the values of the L-images and the S-images, respectively.

A third reconstruction method is the so-called "algebraic combination", which can be described as follows: add to the set of equations, i.e. the basis of the reconstruction of the S-image, an additional set of equations, expressing that the resulting image pixel-values are somewhat close to the L-values of the L-image. The basis for the algebraic combination can be explained in matrix calculus as follows:

The regular SENSE reconstruction is, in essence, solving the following set of equations:

$$S \cdot \vec{p} = \vec{m}$$

where S is the sensitivity matrix, so $S_{ij}$ is the sensitivity of coil i on pixel position j. It is an M by N matrix, where M is the number of coils, i.e. the number of equations, and N the SENSE-factor, or the number of signals folded on each other, i.e. the number of unknowns. m ("measured value") is a vector of length M: the folded information for every coil; p ("pixel") is a vector or set of N unfolded pixels.

The least-square inversion of the problem can be formulated as $$\vec{p} = (S^h \cdot \Psi^{-1} \cdot S)^{-1} \cdot S^h \cdot \Psi^{-1} \cdot \vec{m}$$

where "h" stands for hermitian transposed and Ψ denotes the M×M noise covariance matrix. So far for regular SENSE.

Now we add an additional set of equations:

$$\vec{p} = \vec{m}_L$$

where $\vec{m}_L$ is the corresponding pixel in the L-image.

The combined set of equations can be written as $$\begin{bmatrix} S \\ I_N \end{bmatrix} \cdot \vec{p} = \begin{bmatrix} \vec{m} \\ \vec{m}_L \end{bmatrix}$$

where $I_N$ stands for N×N identity matrix. The solution thereof is given by $$\vec{p} = \left( \begin{bmatrix} S \\ I_N \end{bmatrix} \cdot \Psi_{ext}^{-1} \cdot \begin{bmatrix} S \\ I_N \end{bmatrix} \right)^{-1} \cdot \begin{bmatrix} S \\ I_N \end{bmatrix}^h \cdot \Psi_{ext}^{-1} \cdot \begin{bmatrix} \vec{m} \\ \vec{m}_L \end{bmatrix}$$

The "extended noise covariance matrix" $\Psi_{ext}$ has to be defined as $$\Psi_{ext} = \begin{bmatrix} \Psi & 0 \\ 0 & R \end{bmatrix}$$

In this expression R is a diagonal "regularisation matrix" of size N×N. The diagonal element $R_{ii}$, thereof have to be filled in as the variance of the expected noise in the image, times a certain factor (which steers the trade-off between "too noisy" and "too much resolution loss").

The solution of the combined set of equations simplifies to $$\vec{p} = (S^h \cdot \Psi^{-1} \cdot S + R^{-1})^{-1} \cdot (S^h \cdot \Psi^{-1} \cdot \vec{m} + R^{-1} \cdot \vec{m}_L)$$

This is also a kind of a "weighted addition": if the determinant of S dominates over $R^{-1}$ (which is, in effect, some constant), then the solution approximates the "regular SENSE" reconstruction $\vec{p} = (S^h \cdot \Psi^{-1} \cdot S)^{-1} \cdot (S^h \cdot \Psi^{-1} \cdot \vec{m})$; if the determinant approaches to zero, then $\vec{p} \approx (R^{-1})^{-1} \cdot (R^{-1} \cdot \vec{m}_L) = \vec{m}_L$ The fourth reconstruction scheme is the so-called "full usage". In this scheme any of the previous reconstruction methods can be combined with the following procedure:

reconstruct a combined SENSE-image according to the previous three combination methods, make an inverse Fourier transformation thereof in the SENSE direction(s), substitute the central part of the data thereof with the corresponding form of the L-data (note that this "hard substitution" can be replaced by a weighing function which, depending on $k_y$, gradually changes from "giving full weight to the L-data" to "giving full weight to the combined SENSE data")

make again a Fourier transformation into the image domain.

A further option for above mentioned reconstruction methods is filtering of the L-data before FFT, by multiplying it with a tapering function, e.g. a Riesz function. In addition the L-data can be used for the reconstruction of the coil-sensitivity maps. In regular SENSE the coil-sensitivity maps are usually derived by comparison of coil element data to a body-coil acquisition. However, according to above mentioned methods the body-coil data is not or not necessarily available. It is already proposed to take the root-sum-of-squares (RSSQ) combination of the coil element data instead. Yet, that RSSQ is devoid of phase information, thus differences with pixels of the L-image may be introduced. Therefore it is suggested to take a plain sum of the L-data over the coil elements, which will give a more proper result. If the plain sum can be taken after a very basic phase correction, e.g. correcting L-data of every coil element to have zero average phase.

SENSE can also be applied in three-dimensional acquisitions. That can be done by a reduced k-line density in $k_y$ or $k_z$, or both directions, as long as the product of the reduction factors does not exceed the number of coils. For the L-data region of k-space, i.e. the region of low spatial frequencies acquired with a low SENSE-factor, in principle all combinations of limitations are possible: limitations thereof in $k_y$ or in $k_z$ or in both directions. The last option is only of interest if there is also a SENSE-reduction in both dimensions. Then, the low SENSE-factor region can be e.g. square, circular or rectangular. In the case of dynamic scans, is may be that it is not strictly necessary to acquire the L-data on every frame: in favourable circumstances that data is only used for rather limited image areas. Therefore, the L-data of "old" time frames, e.g. of the first dynamic scan, may also be sufficient for subsequent images.

Although the present method is described in respect with SENSE, it can also be used for the so-called SMASH acquisition as described in details in Magnetic Resonance in Medicine, 38, pages 591603 (1997). The main difference with SENSE is that SMASH manipulates the image in the Fourier-domain or k-space.

What is claimed is:

1. A magnetic resonance method for fast dynamic imaging of a plurality of signals acquired by an array of multiple sensors, comprising the steps of:

providing a sensitivity map of each of the sensors prior to imaging, weighting at least two adjacent sensors recording signals originating from the same imaging position with a sensitivity factor of each respective sensor at each respective imaging position, and calculating an image intensity from the signals measured by the different sensors, wherein a number of phase encoding steps required for carrying out said method is reduced with respect to a full set by segmenting k-space into regions of different acquisition, said segmenting including that a first region of a first acquisition type data of normal magnetic resonance imaging is acquired for a first partial image using one of a full set of phase encoding steps and data of fast dynamic imaging, and that a number of phase encoding steps is reduced in accordance with a low reduction factor with respect to the full set, said segmenting further including that a second region of a second acquisition type data of fast dynamic imaging is acquired for a second partial image using a number of phase encoding steps which is reduced with a full reduction factor, wherein the first and the second partial images are used to form the full image of the object to be imaged, and wherein acquisition in the first and second regions is obtained by regularly scanning over the full object and discarding the data outside the first and second regions.

2. A magnetic resonance method for fast dynamic imaging of a plurality of signals acquired by an array of multiple sensors comprising the steps of:

providing a sensitivity map of each of the sensors prior to imaging, weighting at least two adjacent sensors recording signals originating from the same imaging position with a sensitivity factor of each respective sensor at each respective imaging position, and calculating an image intensity from the signals measured by the different sensors, wherein a number of phase encoding steps required for carrying out said method is reduced with respect to a full set by segmenting k-space into regions of different acquisition, said segmenting including that a first region of a first acquisition type data of normal magnetic resonance imaging is acquired for a first partial image using one of a full set of phase encoding steps and data of fast dynamic imaging, and that a number of phase encoding steps is reduced in accordance with a low reduction factor with respect to the full set, said segmenting further including that a second region of a second acquisition type data of fast dynamic imaging is acquired for a second partial image using a number of phase encoding steps which is reduced with a full reduction factor, wherein the first and the second partial images are used to form the full image of the object to be imaged, wherein the first region and the second region overlap to a predetermined extent, and wherein the resulting image is combined as $$I=f(D)*L+(1-f(D))*S$$

whereas:
I=the resulting image
D=determinant of the equations for every pixel
f(D)=function that approaches 1 for low values of D and approaches 0 for high values of D
L=data of the first region
S data of the second region.

3. The magnetic resonance method according to claim 2, wherein the data of the first region are filtered by multiplying with a tapering function before fast Fourier transformation.

4. The magnetic resonance method according to claim 3, wherein the sensitivity map is derived from a combination of the root sum of squares of the data from each of the sensors.

5. The magnetic resonance method according to claim 3, wherein the sensitivity map is derived from the sum of data of the first region of each of the sensors.

6. The magnetic resonance method according to claim 5, wherein the data of each of the sensors are corrected in phase.

7. The magnetic resonance method according to claim 5, wherein the data of each of the sensors are corrected in phase to an average phase of zero.

8. The magnetic resonance method according to claim 2, wherein the data of the first region are filtered by multiplying with a Riesz function before fast Fourier transformation.

9. A computer program product stored on a computer usable medium for forming a fast dynamic image, the product comprising a computer readable program means for causing the computer to execute the following steps:

recording signals from an array of multiple sensors, scanning an object along phase encoding trajectories, skipping part of the phase encoding trajectories, reconstructing an image from signals recorded by sensors of different spatial positions with respect to the object to be imaged in order to obtain a fast dynamic image, comprising the steps of:

segmenting k-space into regions of different acquisition, reconstructing a first partial image in the region of a first acquisition type from one of data of normal magnetic resonance imaging acquired using a frill set of phase encoding steps and data of fast dynamic imaging acquired using a reduced number of phase encoding steps in accordance with a low reduction factor, reconstructing a second partial image in the region of a second acquisition type from of fast dynamic imaging acquired using a reduced number of phase encoding steps in accordance with a full reduction factor, forming a full image of the scanned object from the first and the second partial images, and wherein acquisition in the region of the first acquisition type and the region of the second acquisition type is obtained by regularly scanning over the full object and discarding the data outside the region of the first acquisition type and the region of the second acquisition type.

* * * * *